(12) United States Patent
Ravnkilde et al.

(10) Patent No.: US 10,419,858 B2
(45) Date of Patent: Sep. 17, 2019

(54) CONDENSER MICROPHONE WITH NON-CIRCULAR MEMBRANE

(71) Applicant: Epcos AG, München (DE)

(72) Inventors: Jan Tue Ravnkilde, Hedehusene (DK); Dennis Mortensen, Frederiksberg C (DK); Morten Ginnerup, Kgs. Lyngby (DK)

(73) Assignee: TDK Corporation, Tokyo (JP)

( * ) Notice: Subject to any disclaimer, the term of this patent is extended or adjusted under 35 U.S.C. 154(b) by 534 days.

(21) Appl. No.: 15/121,831

(22) PCT Filed: Mar. 3, 2014

(86) PCT No.: PCT/EP2014/054094
§ 371 (c)(1),
(2) Date: Aug. 26, 2016

(87) PCT Pub. No.: WO2015/131925
PCT Pub. Date: Sep. 11, 2015

(65) Prior Publication Data
US 2017/0078802 A1  Mar. 16, 2017

(51) Int. Cl.
*H04R 19/04* (2006.01)
*B06B 1/02* (2006.01)
*B81B 3/00* (2006.01)
*H04R 7/16* (2006.01)
*H04R 19/00* (2006.01)

(52) U.S. Cl.
CPC ........... *H04R 19/04* (2013.01); *B06B 1/0292* (2013.01); *B81B 3/0072* (2013.01); *H04R 7/16* (2013.01); *H04R 19/005* (2013.01); *B81B 2201/0257* (2013.01); *B81B 2203/0127* (2013.01); *H04R 2201/003* (2013.01)

(58) Field of Classification Search
CPC ............... B06B 1/0292; B81B 3/0072; B81B 2201/0257; B81B 2203/0127; H04R 7/16; H04R 19/04; H04R 19/005; H04R 2201/003
See application file for complete search history.

(56) References Cited

U.S. PATENT DOCUMENTS 8,913,766 B2 * 12/2014 Bominaar-Silkens ...................... B06B 1/0292
381/150
2009/0153267 A1 * 6/2009 Lutz ........................ B81B 3/007
333/186

FOREIGN PATENT DOCUMENTS

| EP | 2239961 A1 * | 10/2010 | ........... H04R 19/005 |
|---|---|---|---|
| EP | 2239961 A1 | 10/2010 | |
| EP | 2244490 A1 | 10/2010 | |
| EP | 2565153 A1 | 3/2013 | |

(Continued)

OTHER PUBLICATIONS

International Preliminary Report on Patentability corresponding to PCT Application No. PCT/EP2014/054094, The International Bureau of WIPO, dated Sep. 15, 2016; (8 pages).

(Continued)

*Primary Examiner* — Brian Ensey
(74) *Attorney, Agent, or Firm* — Nixon Peabody LLP

(57) ABSTRACT

A non-uniform stress distribution of a MEMS microphone having a non-circular shape is compensated by a structured back plate that has a compensating structure to provide a stress distribution opposite to that of the membrane.

20 Claims, 4 Drawing Sheets

(56) References Cited

FOREIGN PATENT DOCUMENTS

JP          2007243768       9/2007
WO       WO2013071950    5/2013

OTHER PUBLICATIONS

Examination Report for Japanese Application No. 2016-555562, dated Oct. 3, 2017, (2 pages).
International Search Report corresponding to Application No. PCT/EP2014/054094, European Patent Office, dated Dec. 10, 2014; (4 pages).
Pedersen, N. L.: "On Design of a Backplate used in a Hearing Aid"; International Conference on Modeling and Simulation of Microsystems: MSM 2000; An Interdisciplinary Integrative Forum on Modeling, Simulation and Scientific Computing in the Microelectronic, Semicon; 2000; pp. 1-4; ISBN: 978-0-9666135-7-5; http://www.nsti.org/publications/MSM/2000/pdf/T44.04.pdf; (4 pages).

* cited by examiner

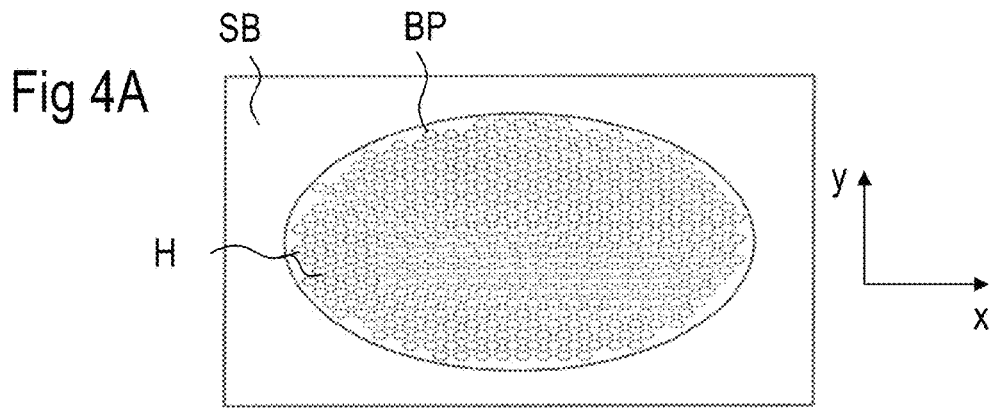
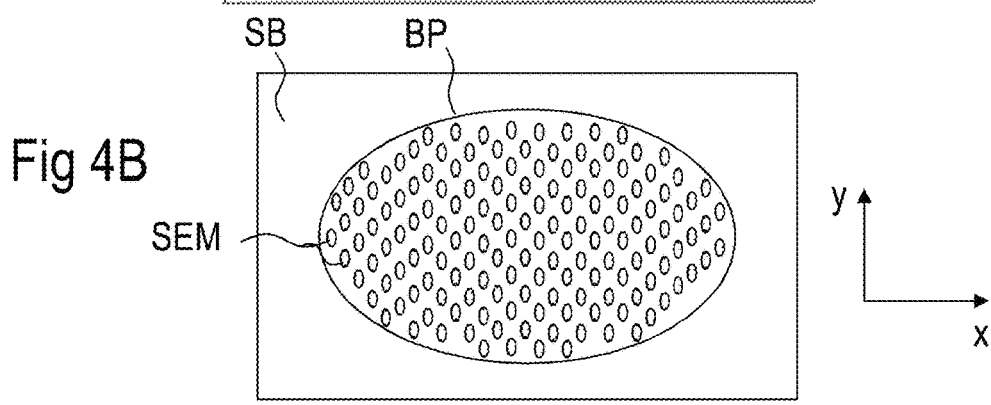
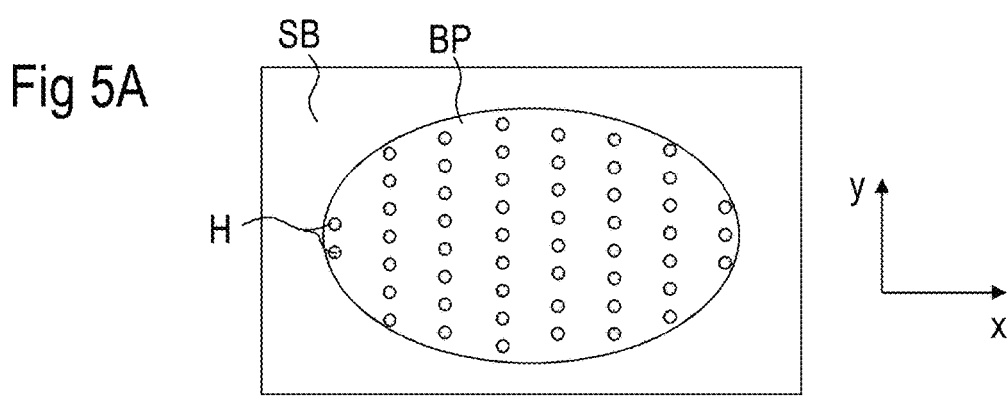
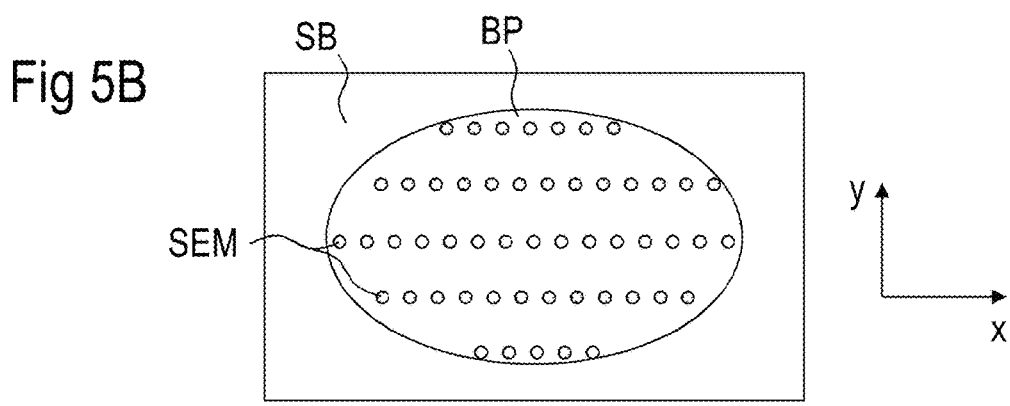

CONDENSER MICROPHONE WITH NON-CIRCULAR MEMBRANE

CROSS-REFERENCE TO RELATED APPLICATIONS

This application is a U.S. National Stage of International Application No. PCT/EP2014/054094, filed Mar. 3, 2014, which is incorporated herein by reference in its entirety.

A condenser MEMS microphone device consists of a flexible membrane that is at least in part electrically conductive, and a stiff back plate as counter electrode.

The membrane and the backplate may be fully suspended by a structured thin film forming anchor means to fix the edges of the membrane and the backplate nearly along the full perimeter thereof. Other solutions use membranes that are only fixed and suspended at some points and can move with more degrees of freedom.

For a fully suspended membrane the sensitivity of the MEMS microphone is strongly dependent on the membrane stress level. For a fully suspended non-circular shaped membrane, the intrinsic stress distribution of the membrane is not uniform as, after a deflection thereof from a relaxed position, tensile stress is different when measured along different axes. The non-uniform stress distribution is a problem since external forces like sound waves will impact onto the membrane differently dependent on the direction of impact. This results in a direction dependent impact on the microphone's sensitivity. This effect is not desired and hence disturbing. So far no solutions for this problem have been described, and hence, MEMS microphones are normally designed with circular shaped membranes.

It is an object of the invention to provide a condenser microphone that avoids the disturbing effects of a non-uniform stress distribution on the membrane and that allows shaping the membrane in an arbitrary manner without producing disturbing effects.

This and other objects are solved by the invention according to claim 1. Embodiments of the invention and advantageous variations are given by further sub-claims.

The basic idea of the invention is not to make uniform the stress impacting on the membrane by any structural change of membrane itself but to compensate the stress by a proper design of the back plate.

A condenser microphone according to the invention has a membrane and a back plate, arranged in parallel to the membrane but distant thereto. Anchor means are provided that are clamping together membrane and back plate or that are clamping the membrane and the back plate to a common substrate body such that membrane and back plate are in intimate mechanical contact with each other.

Non-uniform stress distribution in the membrane may be intrinsic or upon impact of external forces may be a result of a non-circular shape of the membrane or, more general, from different force constants working on the membrane along different axes. This non-uniform stress distribution is compensated by a compensating structure of the back plate. The compensating structure provides a stress distribution opposite to that of the membrane and is preferably adapted to provide a complete compensation of non-uniform stress distribution at the membrane.

By the way, the stress distribution on the membrane is relaxed and made more uniform as the intimate mechanical contact between membrane and back plate via the substrate body renders the stress distribution at the membrane more uniform due to the stress compensating structure of the back plate.

As a result, a microphone according to the invention does not have restrictions any more regarding the shape of the membrane as far as the disturbing and maybe detrimental effects of a non-circular shape of the membrane is reduced or fully compensated by the invention. A further advantage is that the structure of the membrane itself needs not be changed and hence can be optimized according to other specifications. Another advantage is an increased particle resilience, due to non-circular holes.

As the back plate is usually formed as a stiff device, no detrimental effects are resulting when providing a compensating structure at the back plate.

In a given embodiment, the membrane and the back plate have similar or same shapes, both shapes being non-circular. A second diameter of the backplate parallel to a virtual x-axis is elongated with respect to a first diameter parallel to a virtual y-axis. The membrane is suspended to the substrate body as to the back plate as well. Hence, any stress or other mechanical influence impacting on the membrane impacts on the back plate as well and vice versa. As a result, after a deflection of the membrane from a relaxed state, the stress in the membrane parallel to the y-axes would be higher than the stress along the x-axis. In the microphone according to the invention this non-uniform stress distribution is compensated by a compensating structure on the back plate.

According to a first embodiment the compensating structure comprises stress releasing means releasing the stress in a direction parallel to the first diameter of the membrane. Hence, where the membrane has a higher stress along the first diameter, the back plate has a stress along the first diameter lower than the stress along the second diameter. Hence, a compensation of the stress in the membrane results.

An alternative solution making use of the inventive idea is to compensate the non-uniform stress in the membrane is to provide a compensating structure comprising stress enhancing means. Regarding the structure described before where the second diameter of membrane and back plate is elongated the stress enhancing means enhance the stress in a direction parallel to the second diameter of the membrane. Hence, the lower stress in the membrane along the second diameter is compensated by a higher stress along the second diameter in the back plate.

According to an embodiment, the stress releasing means comprise an array of holes within the back plate. At least some of the holes have a shape with a second diameter being elongated with respect to a first diameter. Such a shape can possibly comply with the shapes of the membrane and the back plate.

Such an elongated holes reduce the stress parallel to the first diameter to a greater extent than along the second diameter.

The holes in the back plate may be formed to be through-going and to have nearly vertical sidewalls. It is clear that any other hole which may be not through-going or with non-vertical sidewalls is stress reducing as well. The stress releasing structures that is the holes in the back plate can be the holes that are already present in conventional back plates. But in conventional back plates the holes are formed with a circular cross-section.

If not mentioned otherwise, in all embodiments of the invention, the condenser microphone comprises a membrane and a back plate that have identical or similar shapes. The stress in the membrane in a direction that is parallel to a first diameter thereof is higher than the stress along a second diameter thereof where first and second diameter are different.

According to another embodiment the compensating structure in the back plate comprises an array of stress releasing means that are distributed on the back plate such that the density of the means is higher along a direction parallel to the first diameter than parallel to the second diameter. Hence, the non-uniformity of the compensating structure results only from the distribution of the stress-releasing means and not primarily from the shape of the stress-releasing means. Hence, the stress-releasing means may comprise holes of an arbitrary shape but preferably comprise holes of circular shape. Such circular holes can be produced more easily and hence reduce the effort when manufacturing the condenser microphone with stress releasing means.

In another embodiment, the compensating structure comprises an array of stress enhancing means that are distributed on the back plate such that the density of the means is higher along a direction parallel to the second diameter than parallel to the first diameter. This distribution is opposite to the distribution of the stress-releasing means but has the same effect and the same advantages.

In a preferred embodiment, the first diameter of membrane and back plate is arranged normal to the elongated second diameter. One possible and preferred shape is elliptical. Another preferred shape is a rectangular shape having rounded edges. In a variation of the last mentioned preferred shape, the rounded edges at the shorter side edge of the shape are directly adjacent such that this side edge does not extend along a straight line but is curved or totally rounded along the total side edge.

Stress enhancing means in the back plate can comprise stiffening structures having a shape according to the shape of membrane and back plate. Alternatively, the stiffening structures can be formed regularly or circular and are distributed in an array according to the already mentioned distribution of stress enhancing means.

The stiffening structures may be formed as areas where the back plate has an enhanced thickness or is coated with a coating to enhance the thickness. Preferably, the stiffening structures are formed by a metallization which may be applied additionally or which may be varied in thickness. Stiffening structures may be formed as rims extending over the surface of the back plate as well.

According to a preferred embodiment, the condenser microphone is a micro-miniaturized MEMS microphone that is manufactured or formed in or on a body of a crystalline material like crystalline silicon. Such structure and manufacture of such MEMS microphones are known and need not be described further.

In the following, the invention is explained in more detail with reference to the accompanying figures showing details of the invention and details of some embodiments. The same parts are assigned to the same reference symbols. The drawings are schematic and not drawn to scale such that some parts may be depicted in an enlarged form to better show this detail.

FIGS. 4A and 4B show a top view onto a back plate according to a first embodiment;

FIGS. 5A and 5B show top views onto back plates according to another embodiment of the invention;

Figure 1:
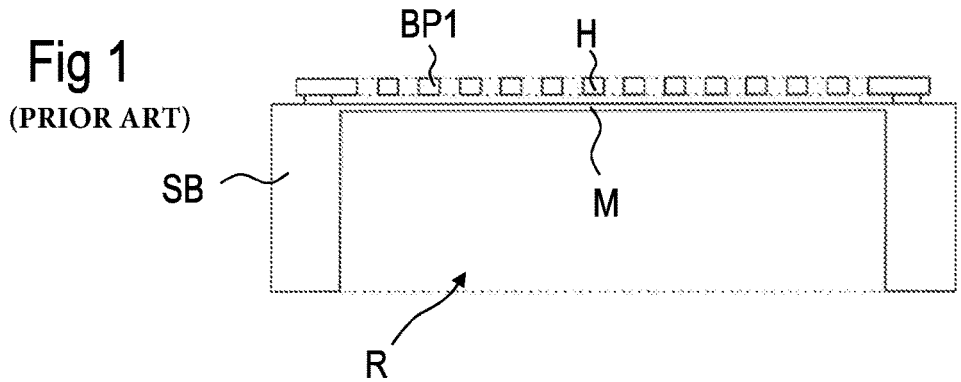
FIG. 1 shows a MEMS microphone in a cross-section through a membrane and back plate.

FIG. 1 shows a cross-section through a MEMS microphone which may be embodied according to the invention. The microphone comprises a substrate body SB wherein a recess R has been structured. A membrane M is covering the recess from the top which may be a continuous plate of substrate material but may be formed later or separately by a layer deposition process. The recess R may be used to provide free access for sound waves or to define a volume below the membrane.

On top of the membrane M a back plate BP is arranged in a small distance to the membrane M. Anchor means AM are supporting the back plate BP on the substrate body such that an intimate mechanical contact between back plate BP and substrate and membrane M results. The back plate BP comprises an array of holes H that may be distributed continuously in the back plate of conventional microphones. The holes serve to provide free access for sound waves that are impacting on the microphone from the top or bottom (see FIG. 2). The back plate BP is formed from a stiff material that normally does not deflect on the impact of sound waves as the membrane M does.

Figure 2:
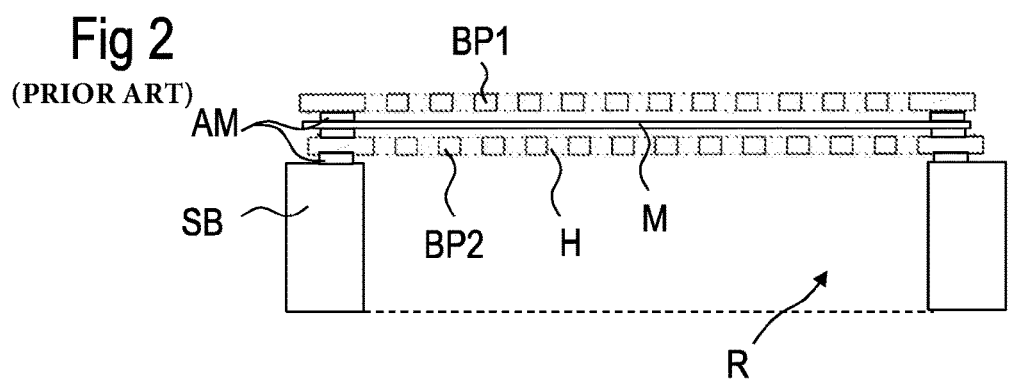
FIG. 2 shows another MEMS microphone having a dual back plate construction.

FIG. 2 shows another embodiment of a MEMS microphone having a dual back plate BP1, BP2. The difference with respect to the embodiment of FIG. 1 is that there are two back plates that are symmetrically arranged above and below the membrane M. This symmetrical arrangement allows a better noise reduction as there can be measured two capacitances, the first being the capacitance between the upper back plate BP1 and the membrane M, the other capacitance results from the potential between the membrane M and the bottom back plate BP2. Such a MEMS microphone per se is known from the art.

Figure 3A:
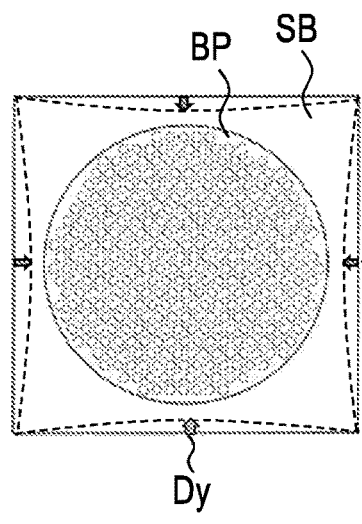
FIG. 3A is a top view onto a conventional back plate with back plate holes.

FIG. 3A shows a top view onto a conventional back plate BP arranged over a recess in a substrate body SB. FIG. 3 shows a conventional array of holes that are uniformly distributed over the circular shape of the back plate BP. Because of the symmetrical circular shaped back plate BP and the uniform distribution of the back plate holes H, this conventional back plate BP shows a uniform stress distribution. A membrane is working together with this circular shaped back plate and is preferably even and continuous. Because of the symmetric back plate design and shape with uniform stress distribution, its stress impact onto the membrane is uniform too resulting in a uniform stress distribution in the membrane.

More specifically, the stress of the backplate results in a displacement of the solid body SB by Dy in the y direction and Dx in the x direction. The ratio of Dy to the y dimension of the membrane gives the stress impact on the membrane in the y direction. Similarly, the ratio Dx to the x dimension of the membrane gives the stress impact on the membrane in the x direction.

For a conventional design according to FIG. 2 Dx and Dy are equal in size and since the membrane is circular the stress impact is also the same for direction x and y.

Figure 3B:
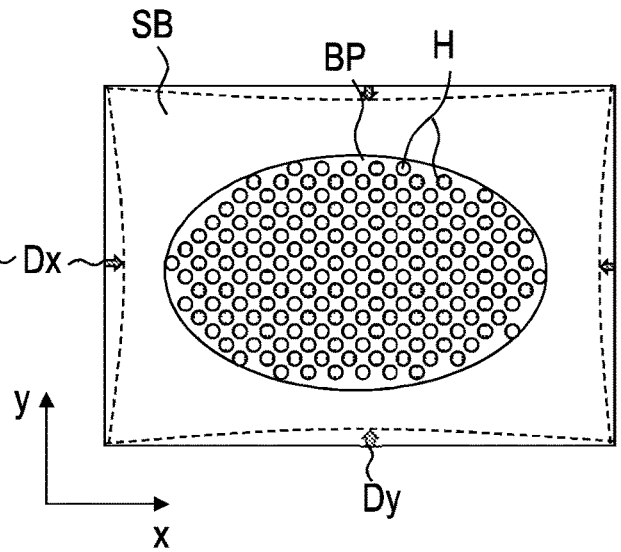
FIG. 3B is a top view onto a non-circular back plate with conventional circular back plate holes.

FIG. 3B shows a top view onto a back plate BP arranged over a recess in a substrate body SB. FIG. 3B shows a conventional array of holes H that are uniformly distributed over the backplate. Here, the backplate however deviates from a circular shape. As an example, an elliptical shape is depicted in FIG. 3B.

Such a backplate and accordingly a matching membrane has a first diameter parallel to the y-axis that is shorter than a second diameter parallel to the x-axis. The circular shaped backplate holes results in an uneven displacement of substrate body SB, because the substrate body SB can more easily displace in Dy compared to Dx due to the longer x dimension of the device. The ratio Dy to the y dimension of the membrane is now larger compared to the ratio Dx to the x dimension of the membrane. The final result is that the backplate impacts onto the membrane stress more in y-direction compared to x-direction.

FIG. 4A shows a top view onto a back plate BP according to a first embodiment of the invention. First, the back plate deviates from a circular shape. As an example, an elliptical shape is depicted in FIG. 4A. Such a back plate and accordingly a matching membrane has a first diameter parallel to the y-axis that is shorter than a second diameter parallel to the x-axis. Hence, according to this lower symmetry of the elliptical shape, the stress parallel to the y-axis (first diameter) upon deflection would be larger than the stress along the x-axis.

To compensate for the stress that impacts on the membrane and the intimate supported back plate compensating means are provided on the back plate which, according to this embodiment, are formed as an array of holes H. At least some of the holes have a second diameter parallel to the x-axis elongated with respect to a first diameter parallel to the y-axis. The shape of the holes may comply or not to the shape of the back plate. Further, the shapes of the holes may be different. Some holes may have a longer second diameter than others. Some holes may have as before a circular shape.

The holes work as stress releasing means, whereby the stress along the y-axis is released to a greater extent than the stress along the x-axis. The array may be regular. By using different shapes for the holes or by elongating only selected holes a desired stress distribution can be designed opposite to the intrinsic stress of the membrane.

FIG. 4B makes use of a the same idea but compensates the non-uniform stress distribution by enhancing the stress along the x-axis. This can be reached in the same way like the embodiment with stress releasing means by forming stress enhancing means SEM with elongated shapes according to the shape of the stress releasing means of FIG. 4A but rotated against the shape of the back plate by 90°.

The stress enhancing means SEM may be formed as stiffening means and comprise areas of enhanced thickness of the back plate. Alternatively, the stress enhancing means SEM may be formed by a coating that has been structured to form stress enhancing means SEM of the above mentioned shape or cross section.

FIG. 5A shows an embodiment with stress releasing means where a non-uniform distribution of the means is chosen to compensate the stress in an alternative way. The stress releasing means are formed as holes H that are distributed such that the density of holes H along the y-axis is higher than the density of the holes along the x-axis. This has the same effect as the arrangement of the shaped stress releasing means, that is the stress releasing holes of FIG. 4A.

The array may be regular. Alternatively the stress releasing means may comprise different shapes within the same array.

FIG. 5B shows the alternative solution where the stress enhancing means SEM are distributed non-uniformly over the back plate BP to be arranged in a density that is higher in the x-direction and lower in the y-direction. The effect of this embodiment is the same as the effect of the shaped stress enhancing means SEM in FIG. 4B.

The array may be regular. Alternatively the enhancing means SEM may comprise different shapes within the same array or distributed.

FIG. 6 shows a particular preferred embodiment how to arrange and distribute the stress compensating structure of the back plate. The embodiment is based on a modular structure imposed upon a regular grid. The grid can be of hexagonal, checkerboard or any other regular pattern. FIG. 6A shows an array based on a hexagonal pattern of circular means that may be holes H or stress enhancing means SEM. To construct a compensating structure therefrom, this pattern is varied to provide a back plate having a stress distribution contrary to the non-uniform stress distribution of the membrane. The concept is valid for stress releasing means and stress enhancing means as well.

Figure 6A:
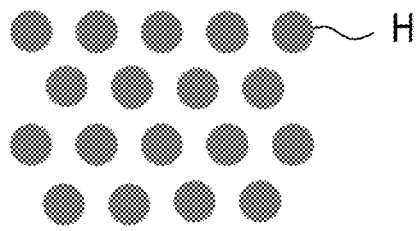
FIG. 6A to 6D show embodiments of compensating structures based on a regular grid.
Figure 6B:
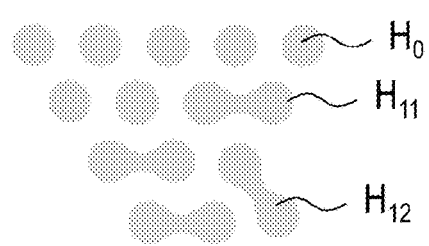
Figure 6C:
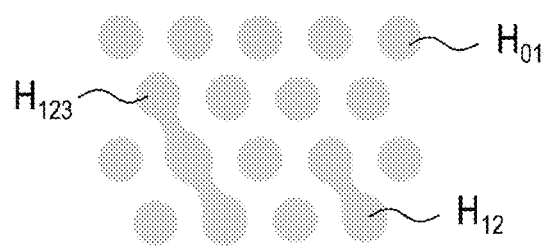
Figure 6D:
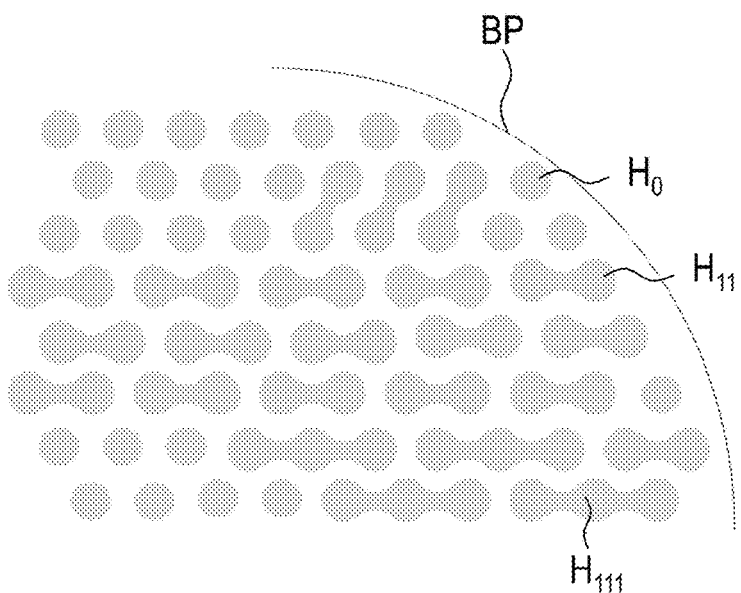

The compensating structure as shown in FIGS. 6B, 6C and 6D consists of an arrangement of circular holes and interconnected circular holes, thus forming elongated holes with shape of a time glass. The orientation of the elongated time glass shaped holes H along one or more preferred directions is chosen to result in a desired stress distribution in the back plate and finally in a uniform stress distribution in the membrane. Such a modular design renders more flexibility in achieving a more uniform stress distribution in the membrane as the direction and density and length of the elongated backplate means can be varied easily across the back plate without corrupting the regular pitch of the basic e.g. hexagonal pattern. This modular design has the further advantage of a uniform frame width giving a higher hole coverage, which in term reduces the total noise of the microphone.

FIG. 6B comprises a pattern where single holes $H_0$ are combined with paired holes $H_{11}$ and $H_{12}$. Here two neighbored holes are paired. Such pairs can have a horizontal extension like hole $H_{11}$, a diagonal extension like hole $H_{12}$, a vertical extension or the array comprises a combination of paired, unpaired and differently oriented means.

FIG. 6C shows a combination of three neighbored holes $H_{123}$ and a hole $H_{12}$ where two holes are paired to a common hole.

FIG. 6D shows a back plate in greater detail comprising single holes, paired holes and holes $H_{123}$ comprising three combined holes.

Figure 7:
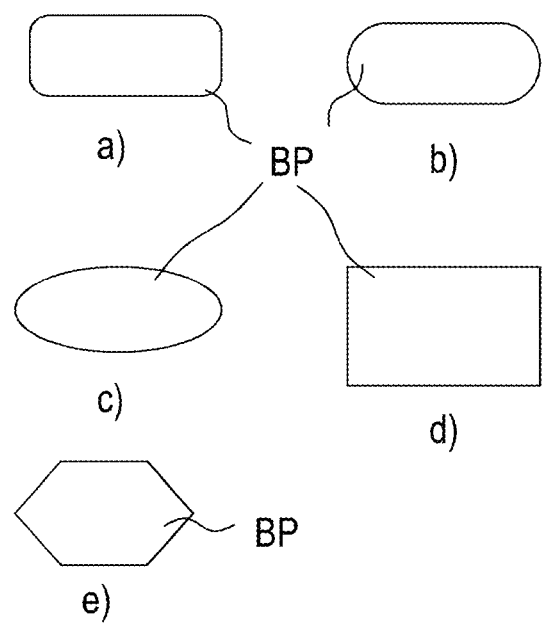
FIG. 7 shows different possible shapes of back plate and membrane according to the invention.

FIG. 7 shows top views onto back plates BP with different shapes that may be used for microphones according to the invention having non-circular shapes. A) depicts a rectangular back plate having rounded corners. B) represents another rectangular shape of a back plate having a rounded side edge. Example C) shows an elliptically shaped back plate BP. Not preferred but possible are rectangular shapes according to D) or polygonal shapes of the back plate BP according to the structure E) which is depicted as a hexagon.

As far as referred to the shape of back plates, it is clear that the assigned membrane has the same or nearly the same shape which is due to technical reasons.

Figure 8:
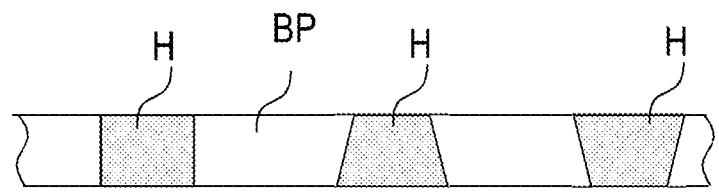
FIG. 8 shows a cross-section through a back plate according to the invention.

FIG. 8 shows a cross-section through a back plate BP and holes H are formed to represent stress releasing means. The cross-section of the holes may be chosen arbitrarily. FIG. 7 shows several possibilities for possible cross-sections of holes H but the invention is not restricted by these shown embodiments. FIG. 7 shows from the left to the right a rectangular cross-section, a trapezoidal cross-section and a conical cross-section. The holes do not necessarily have the same cross-section but due to technical reasons and the manufacture, they normally have.

Figure 9:
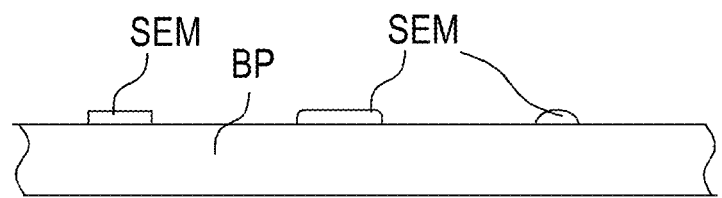
FIG. 9 is a cross-sectional view of a back plate according to another embodiment of the invention.

FIG. 9 shows a cross-section through a back plate BP on which stress enhancing means SEM are formed or deposited as small-area coatings that are arranged in an array according to FIGS. 4 and 5, for example. Shown are exemplary but different cross-sections of stress enhancing means comprising rectangular cross-sections, rectangular cross-sections with rounded corners and a totally rounded cross-section formed like a spherical cap. Other cross-sections of stress enhancing means SEM are possible, too. The figure does not show back plate holes that may be present too within the back plate. But these holes may be formed conventionally in the back plate.

The invention has the great advantage that the construction of microphones according to the invention is not restricted to a circular shape of back plate and membrane. The manufacturing of microphones according to embodiments of the invention using stress releasing means like holes H do not need additional steps. The embodiments using stress enhancing means need an additional step when manufacturing the back plate but this can be done without problems.

A microphone according to the invention has a uniform stress distribution as any distortion due to a non-circular geometrical shape of membrane and back plate is compensated by the compensating structure of the back plate. Thus, the microphone works reliably and independently from the direction a sound wave is impacting onto the microphone. No disturbing effects can be regarded. The dimension of the stress releasing and stress enhancing means is not restricted but may follow the structure of conventional back plates having already an array of holes as shown in FIG. 3, for example. A possible diameter of a hole or a stress enhancing means may be around 6 μm, for example. Elliptical or elongated holes may have a dimension of for example 3.5 μm and 1.8 μm when measured along a first and a second diameter thereof. However, other dimensions are possible, too.

When reducing significantly the smaller dimension of a microphone's membrane it should be noted that there exists a trade-off between stress compensation and increased acoustic noise from back plate holes.

The invention is not restricted by the shown figures and described embodiments as the basic idea can be embodied in other ways, too.

LIST OF TERMS AND REFERENCE SYMBOLS

| | |
|---|---|
| MIC | MEMS microphone |
| M | membrane |
| BP | back plate |
| AM | anchor means |
| SB | substrate body |
| | compensating structure |
| X | axis parallel to a second diameter of membrane longer than first diameter |
| Y | axis parallel to a first diameter of membrane smaller than second diameter |
| H | hole |
| | stress releasing means (e.g. holes) |
| SEM | stress enhancing means (e.g. stiffening structures) |
| | array of holes within the back plate |
| BV | back volume |

The invention claimed is:

1. Condenser microphone comprising
a membrane
a back plate, arranged in parallel but distant to the membrane
anchor means clamping together membrane and back plate or clamping membrane and back plate to a common substrate body such that membrane and back plate are in intimate mechanical contact
wherein the membrane has a non-circular shape and hence a non-uniform mechanical stress distribution upon deflection from a relaxed state
wherein the non-uniform mechanical stress distribution is compensated by a compensating structure of the back plate providing a stress distribution opposite to that of the membrane.

2. The condenser microphone of claim 1,
wherein membrane and back plate have similar shapes
wherein the stress in the membrane in a direction that is parallel to a first diameter thereof is higher than the stress along a second diameter thereof different from the first diameter
wherein the compensating structure comprises stress releasing means that release the stress in a direction parallel to the first diameter of the membrane.

3. The condenser microphone of claim 1,
wherein membrane and back plate have similar shapes
wherein the intrinsic stress distribution is non-uniform in the membrane such that in a direction that is
parallel to a first diameter thereof is higher than the stress along a direction parallel to a second diameter thereof different from the first diameter,
wherein the compensating structure comprises stress enhancing means that enhance the stress in a direction parallel to the second diameter of the membrane.

4. The condenser microphone of claim 2,
wherein the stress releasing means comprises an array of holes within the back plate having a shape according to the shape of membrane and back plate.

5. The condenser microphone of claim 3,
wherein the stress enhancing means comprises an array of stiffening structures having a shape according to the shape of membrane and back plate.

6. The condenser microphone of claim 2,
wherein
the compensating structure comprises an array of stress releasing means distributed on the back plate such that the density of the means is higher along a direction parallel to the first diameter than parallel to the second diameter.

7. The condenser microphone of claim 1,
wherein the first diameter is smaller than the second diameter
wherein the first diameter is arranged normal to the second diameter.

8. The condenser microphone of claim 7,
wherein the shape of membrane and back plate is similar and is elliptical.

9. The condenser microphone of claim 7,
wherein the shapes of membrane and back plate are similar and are both rectangular having rounded edges.

10. The condenser microphone of claim 6,
wherein the stiffening structures are areas wherein the back plate has an enhanced thickness or a coating.

11. The condenser microphone of claim 1,
wherein the condenser microphone is microminiaturized MEMS microphone manufactured in and on a body of crystalline silicon.

12. The condenser microphone of claim 1,
wherein the stress compensating structure is based on a regular pattern of stress releasing or stress enhancing means that is modified such that neighbored means are combined by an extension to a single combined means.

13. The condenser microphone of claim 3, wherein the compensating structure comprises an array of stress enhancing means distributed on the back plate such that the density of the means is higher along a direction parallel to the second diameter than parallel to the first diameter.

14. The condenser microphone of claim 2,
wherein the first diameter is smaller than the second diameter
wherein the first diameter is arranged normal to the second diameter.

15. The condenser microphone of claim 3,
wherein the first diameter is smaller than the second diameter
wherein the first diameter is arranged normal to the second diameter.

16. The condenser microphone of claim 7,
wherein the stiffening structures are areas wherein the back plate has an enhanced thickness or a coating.

17. The condenser microphone of claim 2,
wherein the condenser microphone is microminiaturized MEMS microphone manufactured in and on a body of crystalline silicon.

18. The condenser microphone of claim 3,
wherein the condenser microphone is microminiaturized MEMS microphone manufactured in and on a body of crystalline silicon.

19. The condenser microphone of claim 6,
wherein the condenser microphone is microminiaturized MEMS microphone manufactured in and on a body of crystalline silicon.

20. The condenser microphone of claim 2,
wherein the stress compensating structure is based on a regular pattern of stress releasing or stress enhancing means that is modified such that neighbored means are combined by an extension to a single combined means.

* * * * *